(12) United States Patent
Rao et al.

(10) Patent No.: US 9,362,493 B2
(45) Date of Patent: Jun. 7, 2016

(54) PHASE-CHANGE STORAGE UNIT FOR REPLACING DRAM AND FLASH AND MANUFACTURING METHOD THEREOF

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Feng Rao, Shanghai (CN); Kun Ren, Shanghai (CN); Zhitang Song, Shanghai (CN); Yuefeng Gong, Shanghai (CN); Wanchun Ren, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 46 days.

(21) Appl. No.: 14/129,955

(22) PCT Filed: Dec. 26, 2012

(86) PCT No.: PCT/CN2012/087578
§ 371 (c)(1),
(2) Date: Dec. 28, 2013

(87) PCT Pub. No.: WO2014/040356
PCT Pub. Date: Mar. 20, 2014

(65) Prior Publication Data
US 2015/0188041 A1    Jul. 2, 2015

(30) Foreign Application Priority Data
Sep. 13, 2012   (CN) .......................... 2012 1 0339752

(51) Int. Cl.
*H01L 45/00*    (2006.01)

(52) U.S. Cl.
CPC ............ *H01L 45/1233* (2013.01); *H01L 45/06* (2013.01); *H01L 45/124* (2013.01); *H01L45/1253* (2013.01); *H01L 45/1616* (2013.01); *H01L 45/1641* (2013.01); *H01L 45/1666* (2013.01)

(58) Field of Classification Search
None
See application file for complete search history.

(56) References Cited

U.S. PATENT DOCUMENTS

2007/0069249 A1*   3/2007   Hayakawa ................... 257/246

FOREIGN PATENT DOCUMENTS

CN            101267017 A   *   9/2008

*Primary Examiner* — Anthony Ho
*Assistant Examiner* — Kevin Quinto
(74) *Attorney, Agent, or Firm* — Global IP Services; Tianhua Gu

(57) ABSTRACT

The present invention provides a phase-change storage unit for replacing DRAM and FLASH and a manufacturing method thereof, and the phase-change storage unit includes a phase-change material layer and a cylindrical lower electrode being in contact with and located below the phase-change material layer, where the phase-change material layer is formed by connecting a side wall layer and a round bottom layer, forms a hollow cylinder or hollow inverted conical frustum having an opening at an upper part, and the hollow cylinder or hollow inverted conical frustum is internally filled with a medium layer. The present invention adopts the means of preparing a phase-change material layer with a vertical side wall layer and a phase-change material layer with a slant side wall layer, in which a medium material is filled, and adopts the means of a small electrode, so as to reduce the thickness of the phase-change material layer, thereby reducing the phase-change region during the operation, improving the heat stability and the phase-change speed of the phase-change material layer, and finally achieving purposes of reducing the operating power consumption, improving the device data holding capability, increasing the operating speed of the device, and increasing the number of times of cyclic operating of the device.

6 Claims, 9 Drawing Sheets

PHASE-CHANGE STORAGE UNIT FOR REPLACING DRAM AND FLASH AND MANUFACTURING METHOD THEREOF

CROSS REFERENCE TO RELATED PATENT APPLICATION

The present application is the US national stage of PCT/CN2012/087578 filed on Dec. 26, 2012, which claims the priority of the Chinese patent application No. 201210339752.1 filed on Sep. 13, 2012, which application is incorporated herein by reference.

BACKGROUND OF THE PRESENT INVENTION

1. Field of Invention

The present invention belongs to the field of micro-electronics technologies, specifically to a phase-change storage unit for replacing DRAM and FLASH and a manufacturing method thereof 2. Description of Related Arts A phase-change memory uses an operating signal to generate Joule heat to operate a phase-change material, so that the phase-change material is transformed between different phases, thereby embodying the difference between high and low resistance values, so as to complete storage of information. The phase-change memory has a fast operating speed, a good data holding capability, and a strong cyclic operating capability, is compatible with the conventional CMOS process, and can still maintain the operating performance in a small size, so the phase-change memory is considered as one of the most promising next generation non-volatile memories. With the shrinkage of the device size, the influence of the size effect on the phase-change material is still the research focus of the phase-change memory at present.

The influence of the size effect on the heat stability of the phase-change material researched by researchers is frequently seen in reports. For example, the document (JOURNAL OF APPLIED PHYSICS 103, 114310 (2008)) once reported the change of the crystallization temperature of GeSb, $Sb_2Te$, NGST, GST, and AIST with the change of the thin-film thickness. When the thin-film thickness of the phase-change material is above 10 nanometers, the crystallization temperature of the phase-change material changes very weakly with the change of the thickness. When the thin-film thickness of the phase-change material is below 10 nanometers, the crystallization temperature of the phase-change material is increased to different extents with the reduction of the thin-film thickness. For example, as the thickness of the thin-film is reduced from 10 nanometers to 2 nanometers, crystallization temperatures of $Sb_2Te$, GeSb, GST, and AIST materials are respectively increased by almost 150, 50, 200, and 100° C.

The document (SCIENTIFIC REPORTS 2:360 DOI: 10.1038/srep00360) reports that the size effect also influences the thin-film crystallization speed of the phase-change material simultaneously. When the thickness of the phase-change material is reduced, the specific surface area of the material is increased, and it is easy to form a crystal nucleus because defect exists at the interface. The existence of the crystal nucleus shortens the crystal nucleus forming time for the crystallization procedure of the phase-change material, thereby reducing the time required for the crystallization procedure, so as to improve the operating speed of the phase-change memory. When crystal nucleus forming time is shortened, crystalline grain growth becomes a principal factor of influencing the crystallization time. The crystalline grain growth time is shortened as the size is shrunk, so as to ensure a faster phase-change speed of a device in a small size.

A phase-change memory uses an operating signal to generate Joule heat to operate a phase-change material, so that the phase-change material is transformed between different phases, thereby embodying the difference between high and low resistance values, so as to complete storage of information. The effective part of the operating power consumption is energy of a part, of the phase-change material, which implements phase transformation. The smaller the phase-change region is, the smaller the required energy is, and the device power consumption is reduced. The phase-change memory in a limited structure reduces the device operating power consumption just by reducing the phase-change region. The preparation for an electrode in a small size such as a blade structure or ring-shaped structure also aims to reduce the phase-change region, thereby reducing the power consumption.

The principal failure reason of the phase-change memory is the material homogeneity reduction caused by element segregation of the phase-change material. The element diffusion principally occurs under a high-temperature condition generated by the current during the operation; the longer the high-temperature duration is, the more serious the element segregation is. Therefore, the long-time and high-power operation on the phase-change material facilitates the element segregation, thereby accelerating the device failure, and reducing the number of times at which the device may be cyclically operated. For the specific phase-change memory having low power consumption and fast operating speed, the operating time is short during operating, so the element segregation effect on the material is reduced at each time of operating, which is favorable to the improvement of the cyclic operating capability of the device.

SUMMARY OF THE PRESENT INVENTION

In view of the foregoing disadvantages of the prior art, an object of the present invention is to provide a phase-change storage unit for replacing DRAM and FLASH and a manufacturing method thereof, which are used for solving problems in the prior art that the large size of a phase-change material of a phase-change storage unit causes a slow device operating speed, high power consumption and a low cyclic operating capability.

In order to achieve the above and other relevant objects, the present invention provides a phase-change storage unit for replacing DRAM and FLASH and a manufacturing method thereof. The phase-change storage unit of the present invention is characterized by a high data holding capability, a high speed, and low power consumption.

The present invention adopts the following technical solutions. A phase-change storage unit comprises a phase-change material layer and a cylindrical lower electrode being in contact with and located below the phase-change material layer, where the phase-change material layer is formed by connecting a side wall layer and a round bottom layer, forms a hollow cylinder or hollow inverted conical frustum having an opening at an upper part, and the hollow cylinder or hollow inverted conical frustum is internally filled with a medium layer.

Optionally, a diameter of the round bottom layer is equal to or greater than a diameter of the cylindrical lower electrode.

Optionally, the diameter of the round bottom layer ranges from 5 to 30 nm.

Optionally, the diameter of the cylindrical lower electrode ranges from 2 to 30 nm.

Optionally, a thickness of the round bottom layer ranges from 1 to 10 nm, and a thickness of the side wall layer ranges from 2 to 15 nm.

The present invention further provides a method for manufacturing a phase-change storage unit, comprising the following steps:
  a) providing a metal electrode layer, growing a first medium layer on the metal electrode layer, and preparing a cylindrical hole on the first medium layer, to form the first medium layer with the cylindrical hole, where a depth of the cylindrical hole is equal to a thickness of the first medium layer;
  b) depositing a lower electrode metal material on the first medium layer with the cylindrical hole, and performing polishing to remove the lower electrode metal material except the cylindrical hole, where the remaining lower electrode metal material is even with the first medium layer;
  c) performing etching-back on a structure after the polishing in the step 2), to form a hole in a cylindrical structure or inverted conical frustum structure, where the remaining lower electrode metal material forms a cylindrical lower electrode; and
  d) depositing a phase-change material layer, to form a hollow cylinder or hollow inverted conical frustum formed by connecting a side wall layer and a round bottom layer and having an opening at an upper part; then depositing a second medium layer used for internally filling the hollow cylinder or hollow inverted conical frustum; and then performing polishing to remove redundant second medium and phase-change material except the hole in the cylindrical structure or inverted conical frustum structure until the remaining second medium and phase-change material is even with the first medium layer, and then preparing an upper electrode.

Optionally, in-situ warming is performed when the phase-change material layer is deposited in the step 4); temperature of the in-situ warming ranges from 200 to 400° C.

Optionally, warming is performed when the second medium layer is deposited in the step 4), and temperature of the warming ranges from 200 to 400° C.

Optionally, a diameter of the round bottom layer is equal to or greater than a diameter of the cylindrical lower electrode.

Optionally, a thickness of the round bottom layer ranges from 1 to 10 nm, and a thickness of the side wall layer ranges from 2 to 15 nm.

As described above, the phase-change storage unit for replacing DRAM and FLASH and the manufacturing method thereof of the present invention have the following beneficial effects: the thickness of the thin-film adopting the phase-change material is small, thereby reducing the phase-change region, so as to reduce the operating power consumption of the storage unit RESET to 1E-11 Joule; the small thickness of the phase-change material enables the effect of an interface on improvement of the crystallization speed to become more apparent, thereby increasing the SET operating speed of the device to 500 picoseconds; reduction of the operating power consumption and shrinkage of the operating time reduce the damage on the phase-change material in each operating procedure, so as to increase the maximum number of operable times of the device, thereby enabling the fatigue of the device to reach 1E11; the small thickness of the phase-change material can improve the heat stability of the material, so that the data holding capability of a device using a $Ge_2Sb_2Te_5$ material as a storage medium reaches ten years at 120° C.

LIST OF REFERENCE NUMERALS

Figure 1:
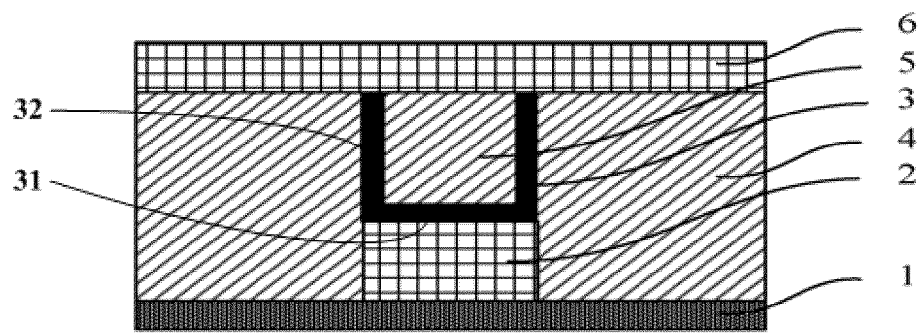
FIG. 1 is a schematic diagram of a phase-change storage unit with a side wall in a vertical structure consistent with the present invention.

1 Metal electrode layer
21 Lower electrode metal material
2 Cylindrical lower electrode
31 Round bottom layer
32 Side wall layer
3 Phase-change material layer
4 First medium layer
5 Second medium layer
6 Upper electrode
7 Cylindrical hole
8 Hole in a cylindrical structure
9 Hole in an inverted conical frustum structure
10 Phase-change region

DETAILED DESCRIPTION OF THE PREFERRED EMBODIMENTS

Implementation manners of the present invention are illustrated below through specific examples, and persons skilled in the art may easily understand other advantages and efficacies of the present invention through the disclosure of this specification. The present invention may further be implemented or applied through additional different specific implementation manners, various modifications or changes may also be made to details in this specification without departing from the spirit of the present invention based on different viewpoints and applications.

Reference is made to FIG. 1 to FIG. 36. It should be noted that, the drawings provided in this embodiment illustrates the basic idea of the present invention only in a schematic manner, so the drawings only show components related to the present invention which are not drawn according to the number, the shape and the size of the components during practical implementation, the type, the quantity and the proportion of the components during practical implementation may be randomly changed, and the component layout type may also be more complex.

Embodiment 1

FIG. 1 is a schematic diagram of a phase-change storage unit with a side wall in a vertical structure consistent with the present invention. As shown in the drawing, the present invention provides a phase-change storage unit, including a metal electrode layer 1, a cylindrical lower electrode 2 located on the metal electrode layer 1, a phase-change material layer 3 located on the cylindrical lower electrode 2 and formed by connecting a round bottom layer 31 and a side wall layer 32, a first medium layer 4 wrapping the phase-change material layer 3 and the lower electrode 2, a second medium layer 5 filled in the phase-change material layer 3, and an upper electrode 6 located on the first medium layer 4, the second medium layer 5 and the phase-change material layer 3.

Specifically, the side wall layer 32 and the round bottom layer 31 of the phase-change material layer 3 are vertical to each other, to form a hollow cylinder having an opening at an upper part. A diameter of the round bottom layer 31 ranges from 5 to 30 nm, and a thickness thereof ranges from 1 to 10 nm. A thickness of the side wall layer ranges from 2 to 15 nm. A diameter of the cylindrical lower electrode 2 is equal to the diameter of the round bottom layer 31. The cylindrical lower electrode 2 and the upper electrode 6 may be made of TiN, W, Al, Ti, Cu, graphite or other conductive materials, and a height of the cylindrical lower electrode 2 is smaller than or equal to 500 nm. The first medium layer 4 and the second medium layer 5 may be made of Sift, $Si_3N_4$ or other insulating materials. In this embodiment, the cylindrical lower electrode 2 is preferably made of TiN or W, and the upper electrode 6 is preferably made of TiN.

Figure 2:
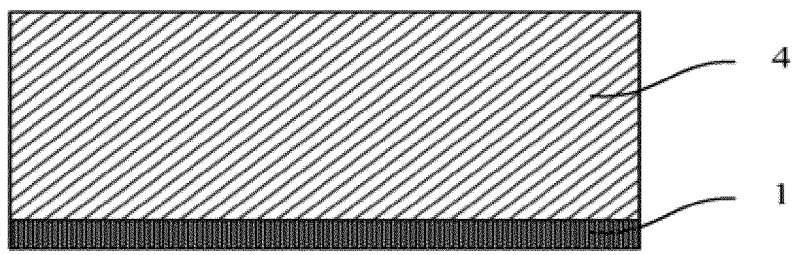
FIG. 2 to FIG. 3 are schematic structural diagrams of a method for manufacturing a phase-change storage unit consistent with the present invention presented in step 1 of Embodiment 1.
Figure 3:
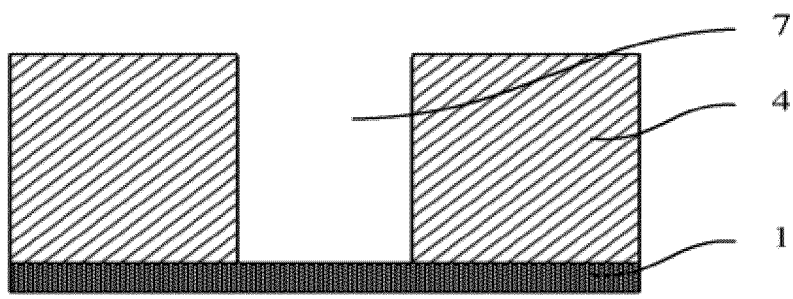

The present invention further provides a method for manufacturing a phase-change storage unit, including the following steps:

Step 1, referring to FIG. 2 to FIG. 3, as shown in FIG. 2, a metal electrode layer 1 is provided, and a first medium layer 4 is grown on the metal electrode layer; as shown in FIG. 3, then gluing, photo-etching, developing, etching, and de-gluing operating are performed, and a cylindrical hole 7 is prepared on the first medium layer 4, to form the first medium layer with the cylindrical hole, where a depth of the cylindrical hole 7 is equal to a thickness of the first medium layer 4; and the metal electrode layer 1 is exposed. Specifically, a diameter of the cylindrical hole 7 ranges from 5 to 30 nm.

Figure 4:
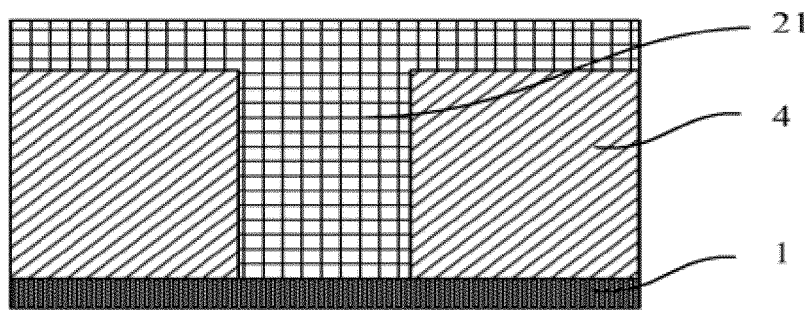
FIG. 4 to FIG. 5 are schematic structural diagrams of a method for manufacturing a phase-change storage unit consistent with the present invention presented in step 2 of Embodiment 1.
Figure 5:
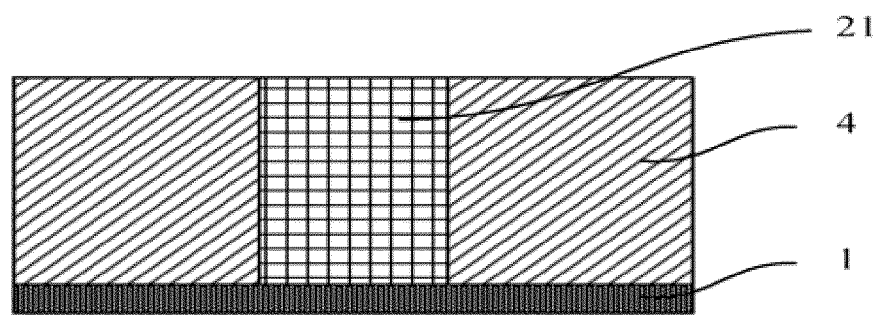

Step 2, referring to FIG. 4 to FIG. 5, as shown in FIG. 4, a lower electrode metal material 21 is deposited on the first medium layer with the cylindrical hole by adopting PVD, ALD or CVD, so that the lower electrode metal material 21 fully fills the cylindrical hole 7 and covers an upper surface of the first medium layer 4; as shown in FIG. 5, polishing is performed to remove the lower electrode metal material, on the first medium layer, except the cylindrical hole 7.

Figure 6:
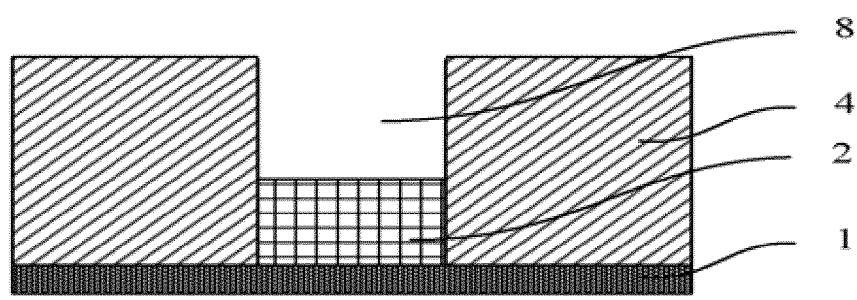
FIG. 6 is a schematic structural diagram of a method for manufacturing a phase-change storage unit consistent with the present invention presented in step 3 of Embodiment 1.

Step 3, referring to FIG. 6, as shown in the drawing, etching-back is performed by adopting gluing, photo-etching, developing, etching, and de-gluing operations, to form a hole 8 in a cylindrical structure on the structure shown in FIG. 5, so that a height of the lower electrode metal material 21 is smaller than the depth of the cylindrical hole 7. The lower electrode metal material 21 remaining between a lower base of the hole 8 in the cylindrical structure and the metal electrode layer forms the cylindrical lower electrode 2. Specifically, a diameter of the hole 8 in the cylindrical structure is equal to the diameter of the cylindrical hole 7, namely, only an upper part of the cylindrical upper electrode in the cylindrical hole 7 is etched away, while the medium around the cylindrical hole 7 is not etched away.

Figure 7:
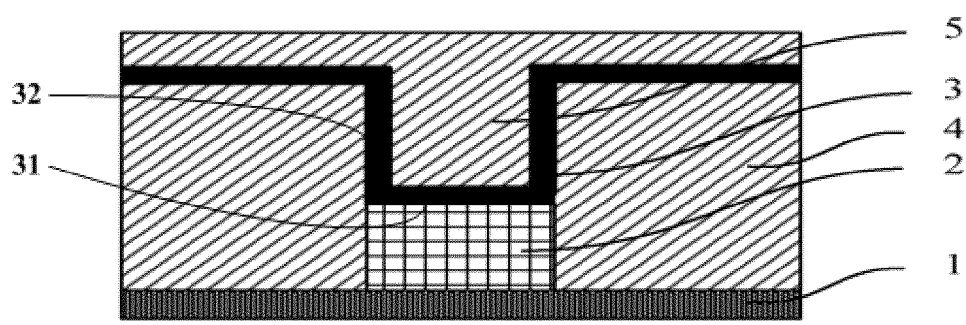
FIG. 7 to FIG. 9 are schematic structural diagrams of a method for manufacturing a phase-change storage unit consistent with the present invention presented in step 4 of Embodiment 1.
Figure 8:
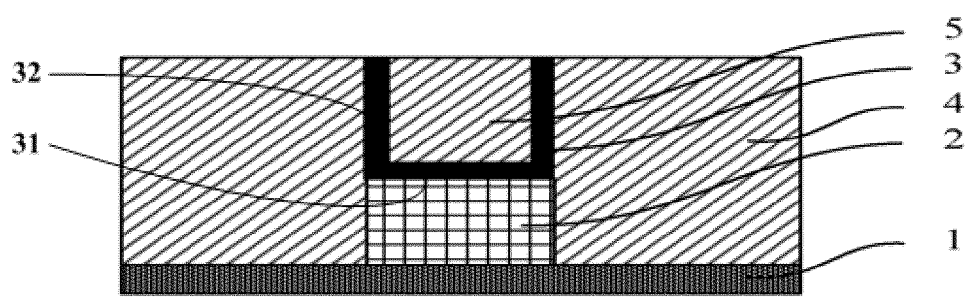
Figure 9:
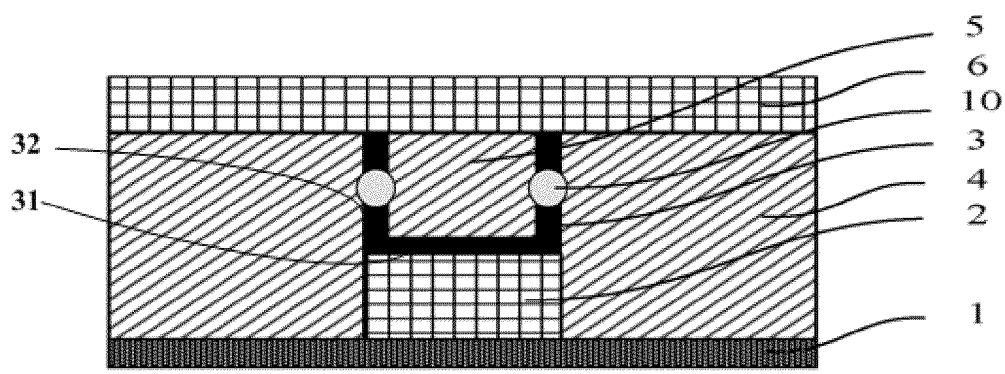

Step 4, referring to FIG. 7 to FIG. 9, as shown in FIG. 7, the phase-change material layer 3 is deposited by adopting PVD, ALD or CVD, to form a hollow cylinder formed by connecting the side wall layer 32 and the round bottom layer 31 and having an opening at an upper part; then the second medium layer 5 used for internally filling the hollow cylinder is deposited by adopting low-temperature ALD or low-temperature CVD; as shown in FIG. 8, polishing is performed to remove redundant second medium and phase-change material except the hole 8 in the cylindrical structure and on the first medium layer 4, until the remaining second medium and phase-change material is even with the first medium layer; as shown in FIG. 9, then the upper electrode 6 is prepared by adopting PVD, ALD or CVD. FIG. 9 schematically shows a phase-change region 10 of the phase-change storage unit in this embodiment.

Specifically, in-situ warming is performed when the phase-change material layer is deposited, so that the phase-change material layer is crystallized during preparation, so as to avoid that the volume shrinkage during transformation from an amorphous state to a crystalline state is left to the device; the temperature of the in-situ warming ranges from 200 to 400° C., so as to avoid that the phase-change material layer generates element segregation or volatilization. Warming may also not be performed when the phase-change material layer is deposited, while warming is performed on the phase-change material layer when the second medium layer is deposited, so that the phase-change material layer is crystallized, the temperature of the warming ranges from 200 to 400° C., so as to avoid that the phase-change material layer generates element segregation or volatilization. The diameter of the round bottom layer 31 ranges from 5 to 30 nm, and the thickness thereof ranges from 1 to 10 nm. The thickness of the side wall layer ranges from 2 to 15 nm. The cylindrical lower electrode 2 and the upper electrode 6 may be made of TiN, W, Al, Ti, Cu, graphite or other conductive materials, and the height of the cylindrical lower electrode 2 is smaller than or equal to 500 nm. The first medium layer 4 and the second medium layer 5 may be made of Sift, $Si_3N_4$ or other insulating materials. In this embodiment, the cylindrical lower electrode 2 is preferably made of TiN or W, and the upper electrode 6 is preferably made of TiN.

In the phase-change storage unit prepared in this implementation, the diameter of the cylindrical lower electrode ranges from 5 to 30 nm, the diameter of the round bottom layer of the phase-change material layer is equal to the diameter of the cylindrical lower electrode, and the side wall layer and the round bottom layer of the phase-change material layer are vertical to each other, to form a phase-change storage unit with a side wall in a vertical structure.

Embodiment 2

Embodiment 2 adopts a technical solution basically the same as that in Embodiment 1, and the difference between the technical solutions lies in that cylindrical lower electrodes of the technical solutions are different. In Embodiment 1, the diameter of the cylindrical lower electrode ranges from 5 to 30 nm, and the diameter of the round bottom layer of the phase-change material layer is equal to the diameter of the cylindrical lower electrode; while in this embodiment, the diameter of the cylindrical lower electrode ranges from 2 to 5 nm, and the diameter of the round bottom layer of the phase-change material layer is greater than the diameter of the cylindrical lower electrode.

Figure 10:
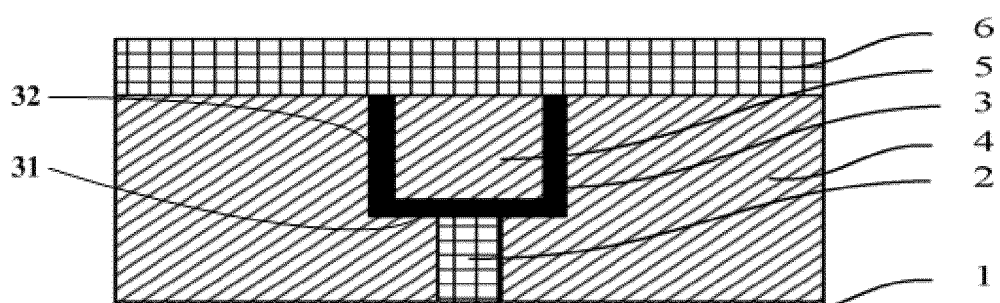
FIG. 10 is a schematic diagram of a phase-change storage unit with a side wall in a vertical structure of a small electrode consistent with the present invention.

FIG. 10 is a schematic diagram of a phase-change storage unit with a side wall in a vertical structure of a small electrode consistent with the present invention. As shown in the drawing, the present invention provides a phase-change storage unit, including a metal electrode layer 1, a cylindrical lower electrode 2 located on the metal electrode layer 1, a phase-change material layer 3 located on the cylindrical lower electrode 2 and formed by connecting a round bottom layer 31 and a side wall layer 32, a first medium layer 4 wrapping the phase-change material layer 3 and the lower electrode 2, a second medium layer 5 filled in the phase-change material layer 3, and an upper electrode 6 located on the first medium layer 4, the second medium layer 5 and the phase-change material layer 3.

Specifically, the side wall layer 32 and the round bottom layer 31 of the phase-change material layer 3 are vertical to each other, to form a hollow cylinder having an opening at an upper part. A diameter of the round bottom layer 31 ranges from 5 to 30 nm, and a thickness thereof ranges from 1 to 10 nm. A thickness of the side wall layer ranges from 2 to 15 nm. A diameter of the cylindrical lower electrode 2 is smaller than the diameter of the round bottom layer 31. The diameter of the cylindrical lower electrode 2 ranges from 2 to 5 nm. The cylindrical lower electrode 2 and the upper electrode 6 may be made of TiN, W, Al, Ti, Cu, graphite or other conductive materials, and a height of the cylindrical lower electrode 2 is smaller than or equal to 500 nm. The first medium layer 4 and the second medium layer 5 may be made of Sift, $Si_3N_4$ or other insulating materials. In this embodiment, the cylindrical lower electrode 2 is preferably made of TiN or W, and the upper electrode 6 is preferably made of TiN.

Figure 11:
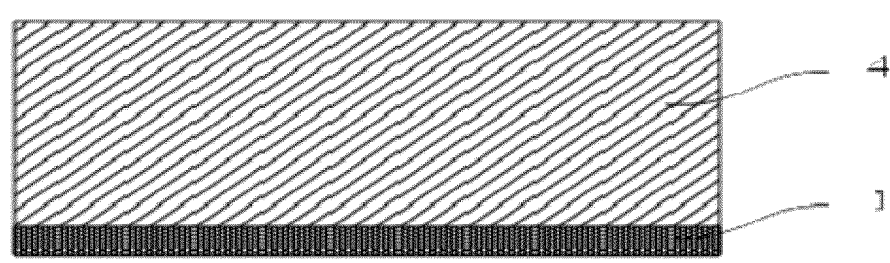
FIG. 11 to FIG. 12 are schematic structural diagrams of a method for manufacturing a phase-change storage unit consistent with the present invention presented in step 1 of Embodiment 2.
Figure 12:
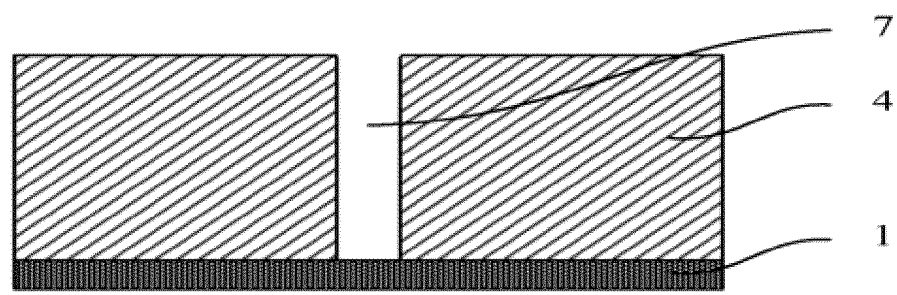

The present invention further provides a method for manufacturing a phase-change storage unit, including the following steps:

Step 1, referring to FIG. 11 to FIG. 12, as shown in FIG. 11, a metal electrode layer 1 is provided, and a first medium layer 4 is grown on the metal electrode layer; as shown in FIG. 3, then gluing, photo-etching, developing, etching, and de-gluing operating are performed, and a cylindrical hole 7 is prepared on the first medium layer 4, to form the first medium layer with the cylindrical hole, where a depth of the cylindrical hole 7 is equal to a thickness of the first medium layer 4; and the metal electrode layer 1 is exposed. Specifically, a diameter of the cylindrical hole 7 ranges from 2 to 5 nm.

Figure 13:
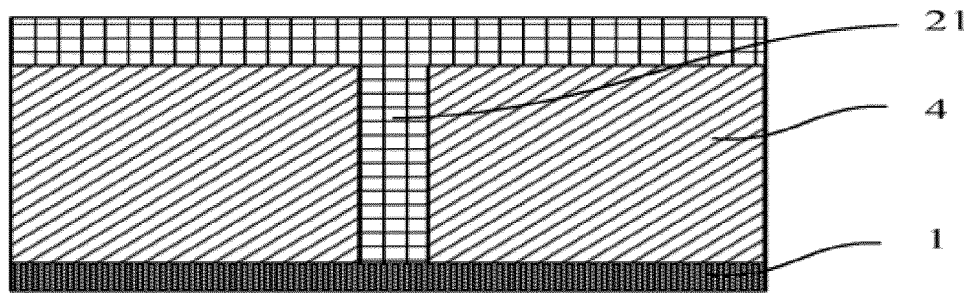
FIG. 13 to FIG. 14 are schematic structural diagrams of a method for manufacturing a phase-change storage unit consistent with the present invention presented in step 2 of Embodiment 2.
Figure 14:
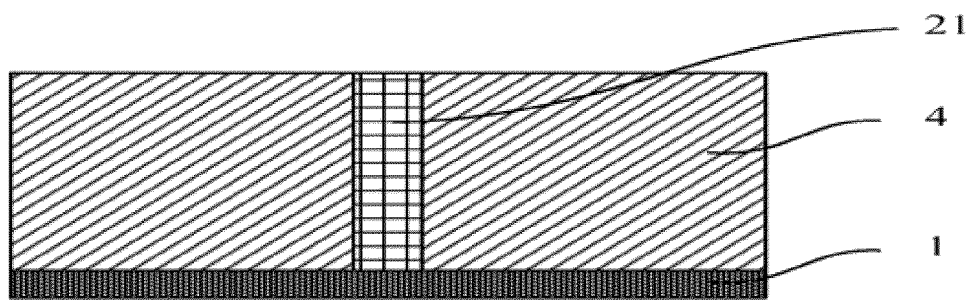

Step 2, referring to FIG. 13 to FIG. 14, as shown in FIG. 13, a lower electrode metal material 21 is deposited on the first medium layer with the cylindrical hole by adopting PVD, ALD or CVD, so that the lower electrode metal material 21 fully fills the cylindrical hole 7 and covers an upper surface of the first medium layer 4; as shown in FIG. 14, polishing is performed to remove the lower electrode metal material, on the first medium layer, except the cylindrical hole 7.

Figure 15:
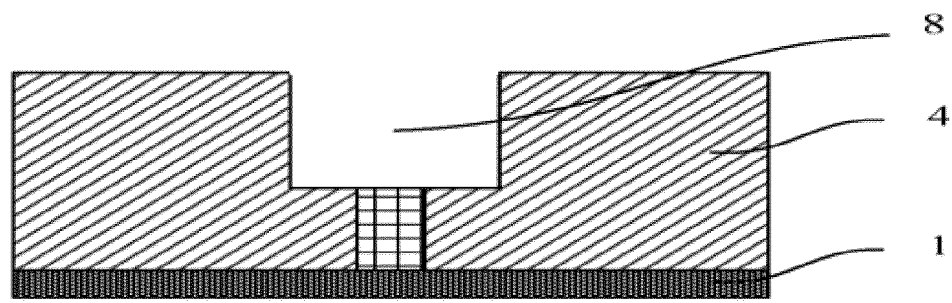
FIG. 15 is a schematic structural diagram of a method for manufacturing a phase-change storage unit consistent with the present invention presented in step 3 of Embodiment 2.

Step 3, referring to FIG. 15, as shown in the drawing, etching-back is performed by adopting gluing, photo-etching, developing, etching, and de-gluing operations, to form a hole 8 in a cylindrical structure on the structure shown in FIG. 14, so that a height of the lower electrode metal material 21 is smaller than the depth of the cylindrical hole 7. The lower electrode metal material 21 remaining between a lower base of the hole 8 in the cylindrical structure and the metal electrode layer forms the cylindrical lower electrode 2. Specifically, a diameter of the hole 8 in the cylindrical structure ranges from 5 to 30 nm, namely, not only is an upper part of the cylindrical upper electrode in the cylindrical hole 7 etched away, but also a part of the medium around the cylindrical hole 7 is etched away.

Figure 16:
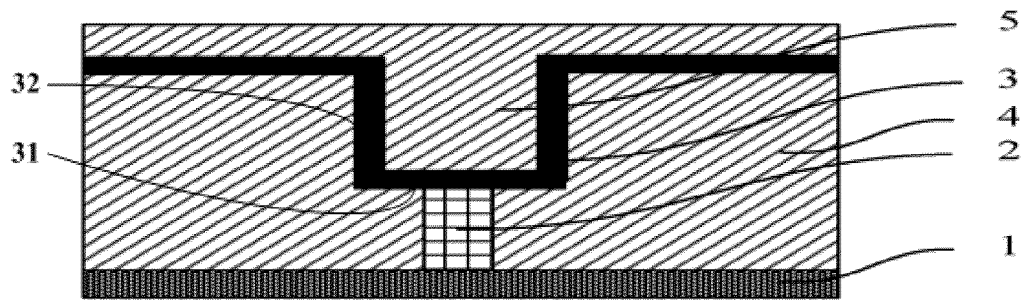
FIG. 16 to FIG. 18 are schematic structural diagrams of a method for manufacturing a phase-change storage unit consistent with the present invention presented in step 4 of Embodiment 2.
Figure 17:
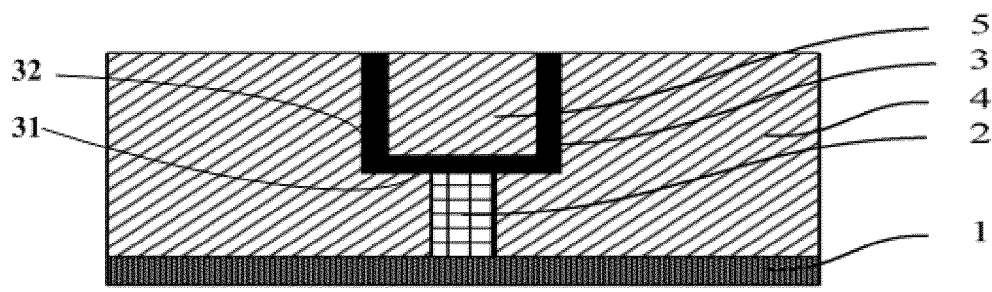
Figure 18:
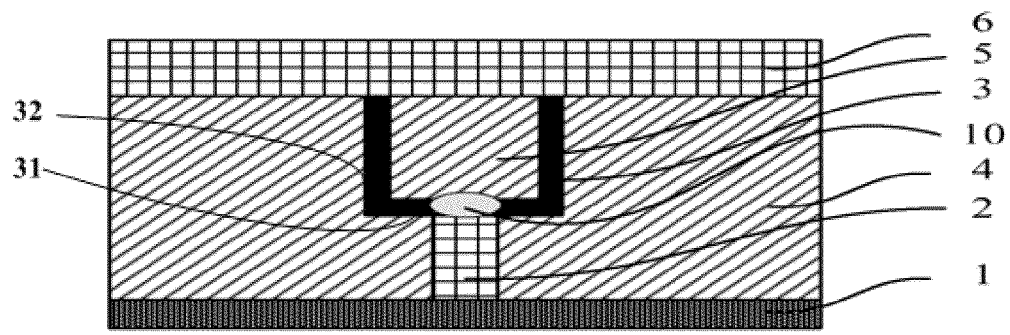

Step 4, referring to FIG. 16 to FIG. 18, as shown in FIG. 16, the phase-change material layer 3 is deposited by adopting PVD, ALD or CVD, to form a hollow cylinder formed by connecting the side wall layer 32 and the round bottom layer 31 and having an opening at an upper part; then the second medium layer 5 used for internally filling the hollow cylinder is deposited by adopting low-temperature ALD or low-temperature CVD; as shown in FIG. 17, polishing is performed to remove redundant second medium and phase-change material except the hole 8 in the cylindrical structure and on the first medium layer 4, until the remaining second medium and phase-change material is even with the first medium layer; as shown in FIG. 18, then the upper electrode 6 is prepared by adopting PVD, ALD or CVD. FIG. 18 schematically shows a phase-change region 10 of the phase-change storage unit in this embodiment.

Specifically, in-situ warming is performed when the phase-change material layer is deposited, so that the phase-change material layer is crystallized during preparation, so as to avoid that the volume shrinkage during transformation from an amorphous state to a crystalline state is left to the device; the temperature of the in-situ warming ranges from 200 to 400° C., so as to avoid that the phase-change material layer generates element segregation or volatilization. Warming may also not be performed when the phase-change material layer is deposited, while warming is performed on the phase-change material layer when the second medium layer is deposited, so that the phase-change material layer is crystallized, the temperature of the warming ranges from 200 to 400° C., so as to avoid that the phase-change material layer generates element segregation or volatilization. The diameter of the round bottom layer 31 ranges from 5 to 30 nm, and the thickness thereof ranges from 1 to 10 nm. The thickness of the side wall layer ranges from 2 to 15 nm. The cylindrical lower electrode 2 and the upper electrode 6 may be made of TiN, W, Al, Ti, Cu, graphite or other conductive materials, and the height of the cylindrical lower electrode 2 is smaller than or equal to 500 nm. The first medium layer 4 and the second medium layer 5 may be made of Sift, $Si_3N_4$ or other insulating materials. In this embodiment, the cylindrical lower electrode 2 is preferably made of TiN or W, and the upper electrode 6 is preferably made of TiN.

In the phase-change storage unit prepared in this implementation, the diameter of the cylindrical lower electrode ranges from 2 to 5 nm, the diameter of the round bottom layer of the phase-change material layer is greater than the diameter of the cylindrical lower electrode, and the side wall layer and the round bottom layer of the phase-change material layer are vertical to each other, to form a phase-change storage unit with a side wall in a vertical structure of a small electrode.

Embodiment 3

Embodiment 3 adopts a technical solution basically the same as that in Embodiment 1, and the difference between the technical solutions lies in that phase-change material layers of the technical solutions are different. In Embodiment 1, the side wall layer and the round bottom layer of the phase-change material layer are vertical to each other, to form a hollow cylinder having an opening at an upper part. While in this embodiment, the side wall layer and the round bottom layer of the phase-change material layer are not vertical to each other, to form a hollow inverted conical frustum having an opening at an upper part.

Figure 19:
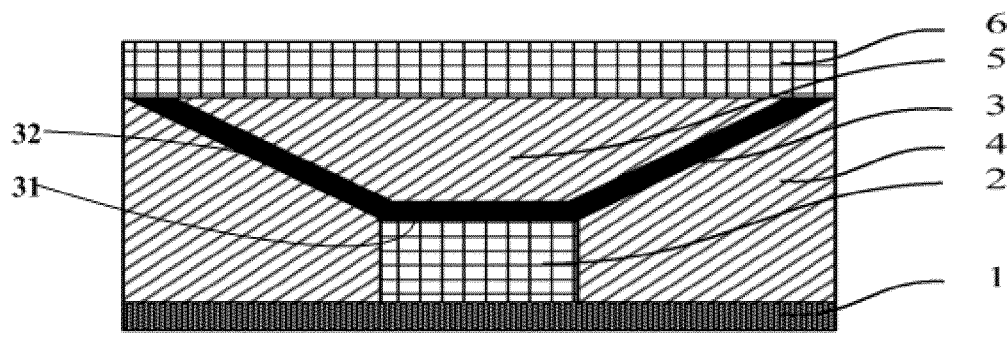
FIG. 19 is a schematic diagram of a phase-change storage unit with a side wall in a slant structure consistent with the present invention.

FIG. 19 is a schematic diagram of a phase-change storage unit with a side wall in a slant structure consistent with the present invention. The present invention provides a phase-change storage unit, including a metal electrode layer 1, a cylindrical lower electrode 2 located on the metal electrode layer 1, a phase-change material layer 3 located on the cylindrical lower electrode 2 and formed by connecting a round bottom layer 31 and a side wall layer 32, a first medium layer 4 wrapping the phase-change material layer 3 and the lower electrode 2, a second medium layer 5 filled in the phase-change material layer 3, and an upper electrode 6 located on the first medium layer 4, the second medium layer 5 and the phase-change material layer 3.

Specifically, the side wall layer 32 and the round bottom layer 31 of the phase-change material layer 3 are not vertical to each other, to form a hollow inverted conical frustum having an opening at an upper part. A diameter of the round bottom layer 31 ranges from 5 to 30 nm, and a thickness thereof ranges from 1 to 10 nm. A thickness of the side wall layer ranges from 2 to 15 nm. A diameter of the cylindrical lower electrode 2 is equal to the diameter of the round bottom layer 31. The cylindrical lower electrode 2 and the upper electrode 6 may be made of TiN, W, Al, Ti, Cu, graphite or other conductive materials, and a height of the cylindrical lower electrode 2 is smaller than or equal to 500 nm. The first medium layer 4 and the second medium layer 5 may be made of $SiO_2$, $Si_3N_4$ or other insulating materials. In this embodiment, the cylindrical lower electrode 2 is preferably made of TiN or W, and the upper electrode 6 is preferably made of TiN.

Figure 20:
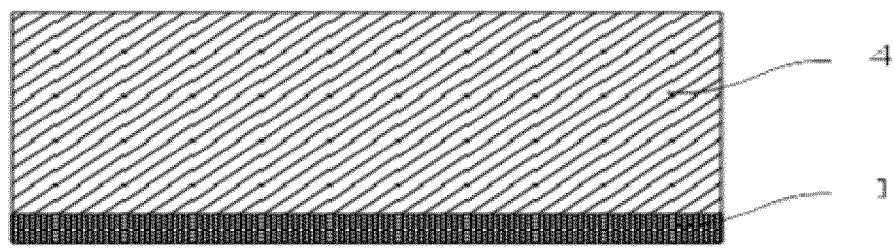
FIG. 20 to FIG. 21 are schematic structural diagrams of a method for manufacturing a phase-change storage unit consistent with the present invention presented in step 1 of Embodiment 3.
Figure 21:
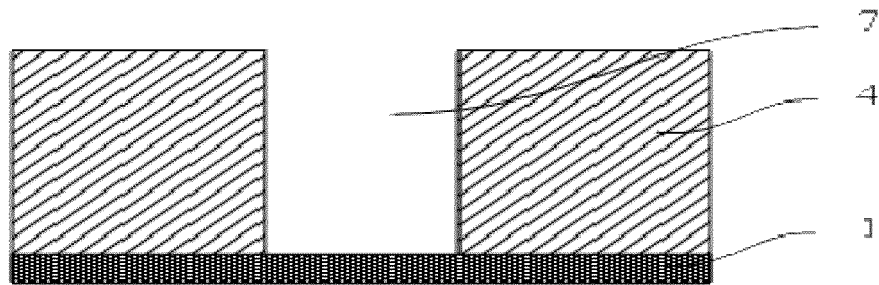

The present invention further provides a method for manufacturing a phase-change storage unit, including the following steps:

Step 1, referring to FIG. 20 to FIG. 21, as shown in FIG. 20, a metal electrode layer 1 is provided, and a first medium layer 4 is grown on the metal electrode layer; as shown in FIG. 21, then gluing, photo-etching, developing, etching, and de-gluing operating are performed, and a cylindrical hole 7 is prepared on the first medium layer 4, to form the first medium layer with the cylindrical hole, where a depth of the cylindrical hole 7 is equal to a thickness of the first medium layer 4; and the metal electrode layer 1 is exposed. Specifically, a diameter of the cylindrical hole 7 ranges from 5 to 30 nm.

Figure 22:
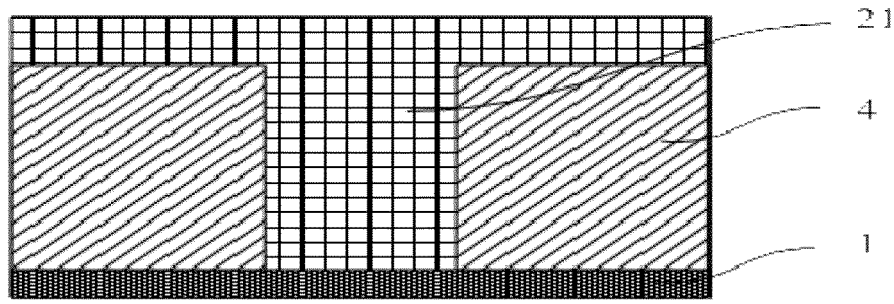
FIG. 22 to FIG. 23 are schematic structural diagrams of a method for manufacturing a phase-change storage unit consistent with the present invention presented in step 2 of Embodiment 3.
Figure 23:
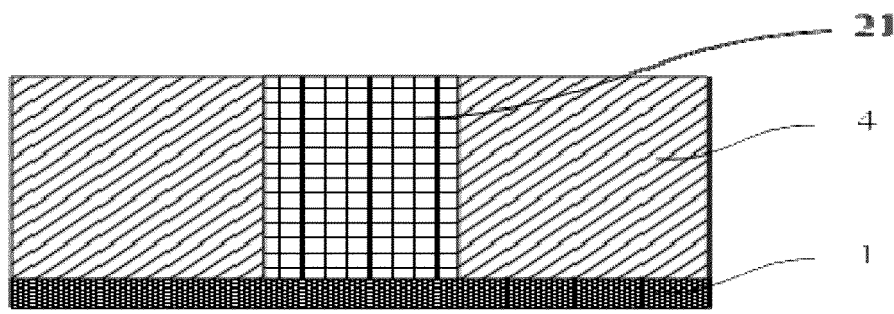

Step 2, referring to FIG. 22 to FIG. 23, as shown in FIG. 22, a lower electrode metal material 21 is deposited on the first medium layer with the cylindrical hole by adopting PVD, ALD or CVD, so that the lower electrode metal material 21 fully fills the cylindrical hole 7 and covers an upper surface of the first medium layer 4; as shown in FIG. 23, polishing is performed to remove the lower electrode metal material, on the first medium layer, except the cylindrical hole 7.

Figure 24:
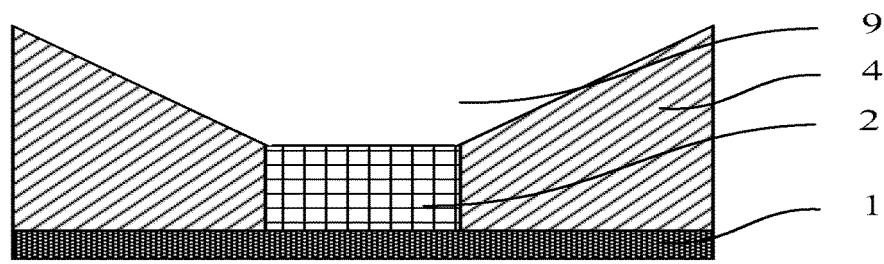
FIG. 24 is a schematic structural diagram of a method for manufacturing a phase-change storage unit consistent with the present invention presented in step 3 of Embodiment 3.

Step 3, referring to FIG. 24, as shown in the drawing, etching-back is performed by adopting gluing, photo-etching, developing, etching, and de-gluing operations, to form a hole 9 in an inverted conical frustum structure on the structure shown in FIG. 23, so that a height of the lower electrode metal material 21 is smaller than the depth of the cylindrical hole 7. The lower electrode metal material 21 remaining between the lower base of the hole 9 in the inverted conical frustum structure and the metal electrode layer forms the cylindrical lower electrode 2. Specifically, a diameter of a lower base of the hole 9 in the inverted conical frustum structure is equal to the diameter of the cylindrical hole 7, and a diameter of an upper base is greater than the diameter of the lower base, namely, not only is an upper part of the cylindrical upper electrode in the cylindrical hole 7 etched away, but also a part of the medium around the cylindrical hole 7 is etched away.

Figure 25:
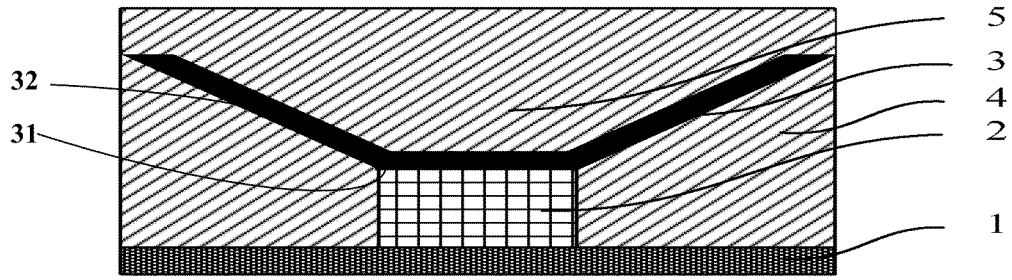
FIG. 25 to FIG. 27 are schematic structural diagrams of a method for manufacturing a phase-change storage unit consistent with the present invention presented in step 4 of Embodiment 3.
Figure 26:
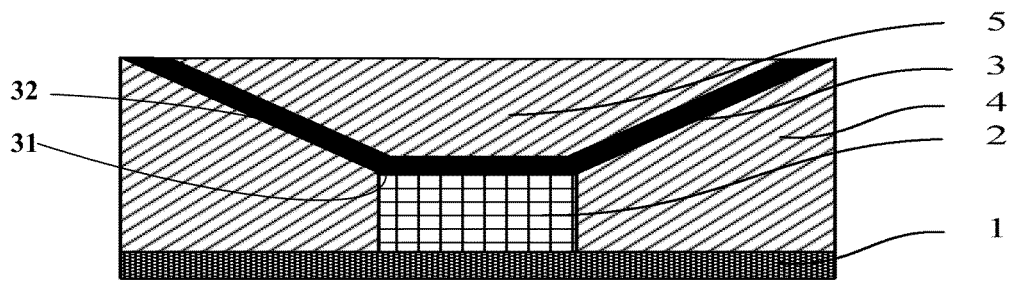
Figure 27:
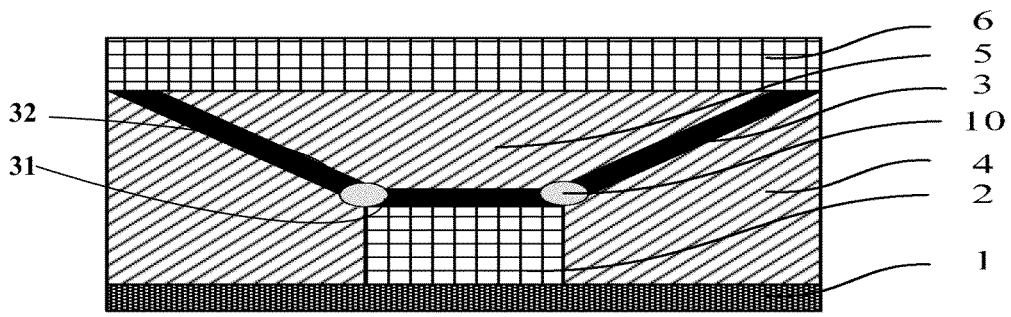

Step 4, referring to FIG. 25 to FIG. 27, as shown in FIG. 25, the phase-change material layer 3 is deposited by adopting PVD, ALD or CVD, to form a hollow inverted conical frustum formed by connecting the side wall layer 32 and the round bottom layer 31 and having an opening at an upper part; then the second medium layer 5 used for internally filling the hollow inverted conical frustum is deposited by adopting low-temperature ALD or low-temperature CVD; as shown in FIG. 26, polishing is performed to remove redundant second medium and phase-change material except the hole 8 in the cylindrical structure and on the first medium layer 4, until the remaining second medium and phase-change material is even with the first medium layer; as shown in FIG. 27, then the upper electrode 6 is prepared by adopting PVD, ALD or CVD. FIG. 27 schematically shows a phase-change region 10 of the phase-change storage unit in this embodiment.

Specifically, in-situ warming is performed when the phase-change material layer is deposited, so that the phase-change material layer is crystallized during preparation, so as to avoid that the volume shrinkage during transformation from an amorphous state to a crystalline state is left to the device; the temperature of the in-situ warming ranges from 200 to 400° C., so as to avoid that the phase-change material layer generates element segregation or volatilization. Warming may also not be performed when the phase-change material layer is deposited, while warming is performed on the phase-change material layer when the second medium layer is deposited, so that the phase-change material layer is crystallized, the temperature of the warming ranges from 200 to 400° C., so as to avoid that the phase-change material layer generates element segregation or volatilization. The diameter of the round bottom layer 31 ranges from 5 to 30 nm, and the thickness thereof ranges from 1 to 10 nm. The thickness of the side wall layer ranges from 2 to 15 nm. The cylindrical lower electrode 2 and the upper electrode 6 may be made of TiN, W, Al, Ti, Cu, graphite or other conductive materials, and the height of the cylindrical lower electrode 2 is smaller than or equal to 500 nm. The first medium layer 4 and the second medium layer 5 may be made of $SiO_2$, $Si_3N_4$ or other insulating materials. In this embodiment, the cylindrical lower electrode 2 is preferably made of TiN or W, and the upper electrode 6 is preferably made of TiN.

In the phase-change storage unit prepared in this implementation, the diameter of the cylindrical lower electrode ranges from 5 to 30 nm, the diameter of the round bottom layer of the phase-change material layer is equal to the diameter of the cylindrical lower electrode, and the side wall layer and the round bottom layer of the phase-change material layer are not vertical to each other, to form a phase-change storage unit with a side wall in a slant structure.

Embodiment 4

Embodiment 4 adopts a technical solution basically the same as that in Embodiment 3, and the difference between the technical solutions lies in that cylindrical lower electrodes of the technical solutions are different. In Embodiment 3, the diameter of the cylindrical lower electrode ranges from 5 to 30 nm, and the diameter of the round bottom layer of the phase-change material layer is equal to the diameter of the cylindrical lower electrode; while in this embodiment, the diameter of the cylindrical lower electrode ranges from 2 to 5 nm, and the diameter of the round bottom layer of the phase-change material layer is greater than the diameter of the cylindrical lower electrode.

Figure 28:
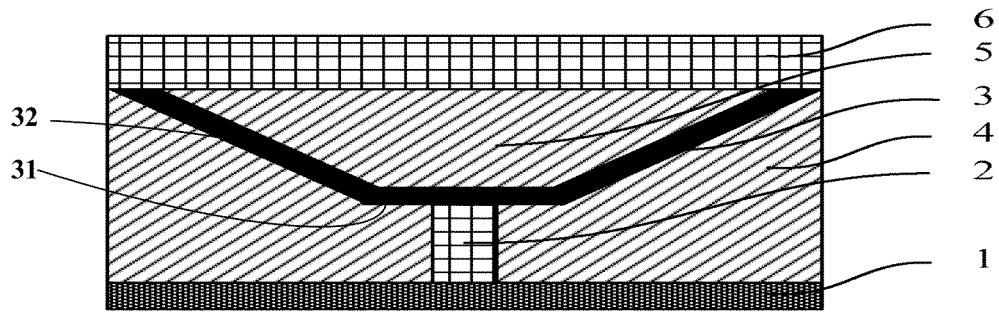
FIG. 28 is a schematic diagram of a phase-change storage unit with a side wall in a slant structure of a small electrode consistent with the present invention.

FIG. 28 is a schematic diagram of a phase-change storage unit with a side wall in a slant structure of a small electrode consistent with the present invention. As shown in the drawing, the present invention provides a phase-change storage unit, including a metal electrode layer 1, a cylindrical lower electrode 2 located on the metal electrode layer 1, a phase-change material layer 3 located on the cylindrical lower electrode 2 and formed by connecting a round bottom layer 31 and a side wall layer 32, a first medium layer 4 wrapping the phase-change material layer 3 and the lower electrode 2, a second medium layer 5 filled in the phase-change material layer 3, and an upper electrode 6 located on the first medium layer 4, the second medium layer 5 and the phase-change material layer 3.

Specifically, the side wall layer 32 and the round bottom layer 31 of the phase-change material layer 3 are not vertical to each other, to form a hollow inverted conical frustum having an opening at an upper part. A diameter of the round bottom layer 31 ranges from 5 to 30 nm, and a thickness thereof ranges from 1 to 10 nm. A thickness of the side wall layer ranges from 2 to 15 nm. A diameter of the cylindrical lower electrode 2 is smaller than the diameter of the round bottom layer 31. The diameter of the cylindrical lower electrode 2 ranges from 2 to 5 nm. The cylindrical lower electrode 2 and the upper electrode 6 may be made of TiN, W, Al, Ti, Cu, graphite or other conductive materials, and a height of the cylindrical lower electrode 2 is smaller than or equal to 500 nm. The first medium layer 4 and the second medium layer 5 may be made of $SiO_2$, $Si_3N_4$ or other insulating materials. In this embodiment, the cylindrical lower electrode 2 is preferably made of TiN or W, and the upper electrode 6 is preferably made of TiN.

Figure 29:
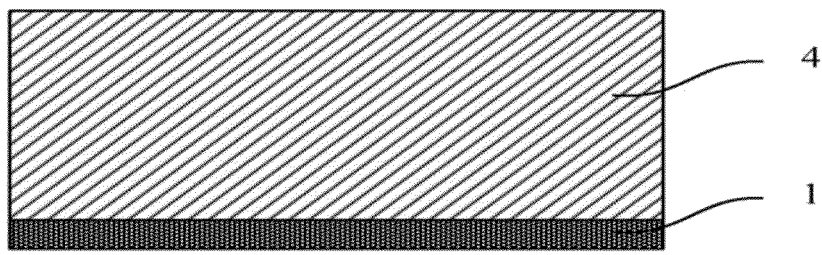
FIG. 29 to FIG. 30 are schematic structural diagrams of a method for manufacturing a phase-change storage unit consistent with the present invention presented in step 1 of Embodiment 4.
Figure 30:
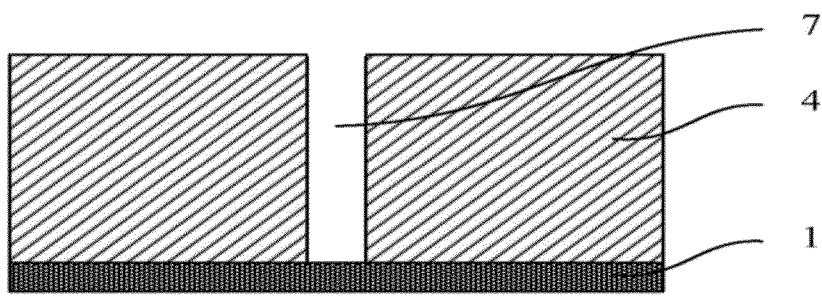

The present invention further provides a method for manufacturing a phase-change storage unit, including the following steps:

Step 1, referring to FIG. 29 to FIG. 30, as shown in FIG. 29, a metal electrode layer 1 is provided, and a first medium layer 4 is grown on the metal electrode layer; as shown in FIG. 30, then gluing, photo-etching, developing, etching, and de-gluing operating are performed, and a cylindrical hole 7 is prepared on the first medium layer 4, to form the first medium layer with the cylindrical hole, where a depth of the cylindrical hole 7 is equal to a thickness of the first medium layer 4; and the metal electrode layer 1 is exposed. Specifically, a diameter of the cylindrical hole 7 ranges from 2 to 5 nm.

Figure 31:
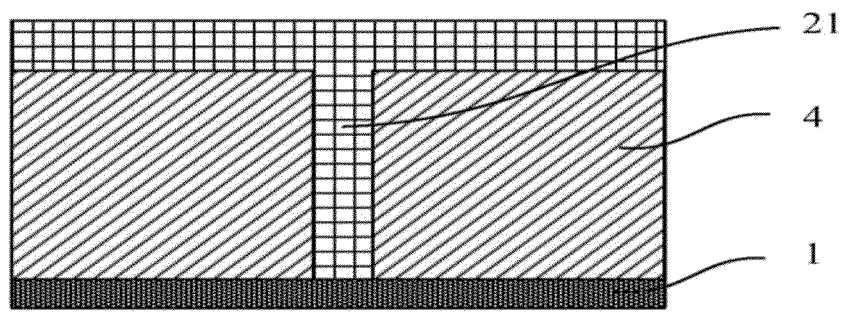
FIG. 31 to FIG. 32 are schematic structural diagrams of a method for manufacturing a phase-change storage unit consistent with the present invention presented in step 2 of Embodiment 4.
Figure 32:
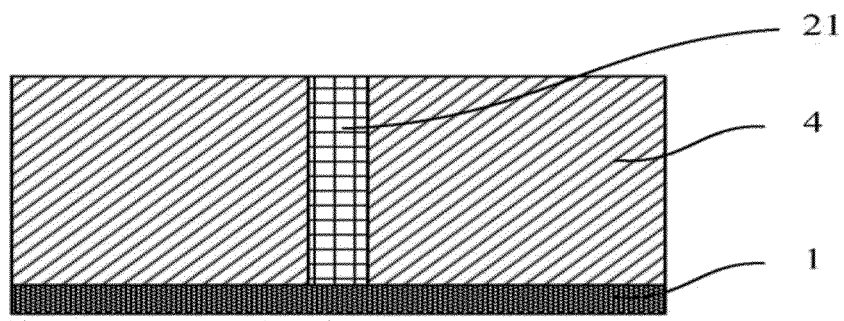

Step 2, referring to FIG. 31 to FIG. 32, as shown in FIG. 31, a lower electrode metal material 21 is deposited on the first medium layer with the cylindrical hole by adopting PVD, ALD or CVD, so that the lower electrode metal material 21 fully fills the cylindrical hole 7 and covers an upper surface of the first medium layer 4; as shown in FIG. 32, polishing is performed to remove the lower electrode metal material 21, on the first medium layer, except the cylindrical hole 7.

Figure 33:
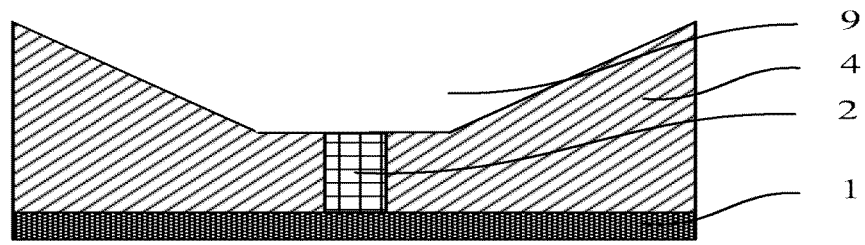
FIG. 33 is a schematic structural diagram of a method for manufacturing a phase-change storage unit consistent with the present invention presented in step 3 of Embodiment 4.

Step 3, referring to FIG. 33, as shown in the drawing, etching-back is performed by adopting gluing, photo-etching, developing, etching, and de-gluing operations, to form a hole 9 in an inverted conical frustum structure on the structure shown in FIG. 32, so that a height of the lower electrode 2 is smaller than the depth of the cylindrical hole 7. The lower electrode metal material 21 remaining between the lower base of the hole 9 in the inverted conical frustum structure and the metal electrode layer forms the cylindrical lower electrode 2. Specifically, a diameter of a lower base of the hole 9 in the inverted conical frustum structure is greater than the diameter of the cylindrical hole 7, and a diameter of an upper base is greater than the diameter of the lower base, namely, not only is an upper part of the cylindrical upper electrode in the cylindrical hole 7 etched away, but also a part of the medium around the cylindrical hole 7 is etched away.

Figure 34:
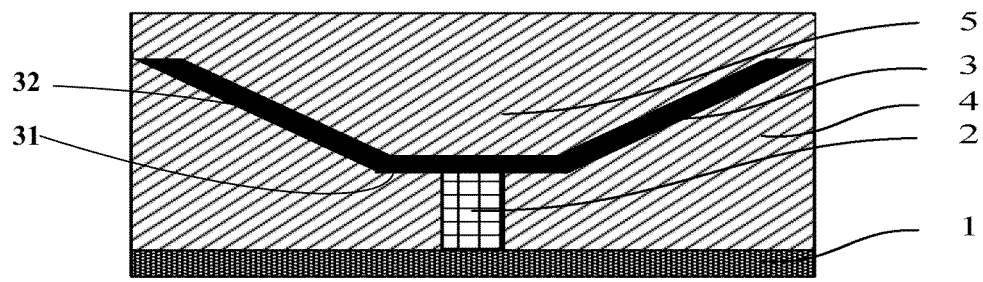
FIG. 34 to FIG. 36 are schematic structural diagrams of a method for manufacturing a phase-change storage unit consistent with the present invention presented in step 4 of Embodiment 4.
Figure 35:
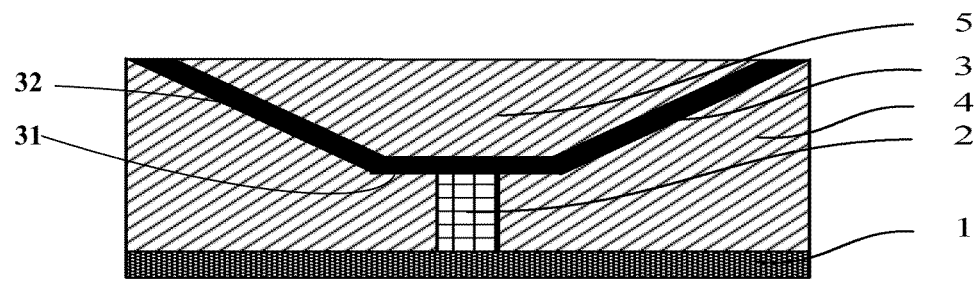
Figure 36:
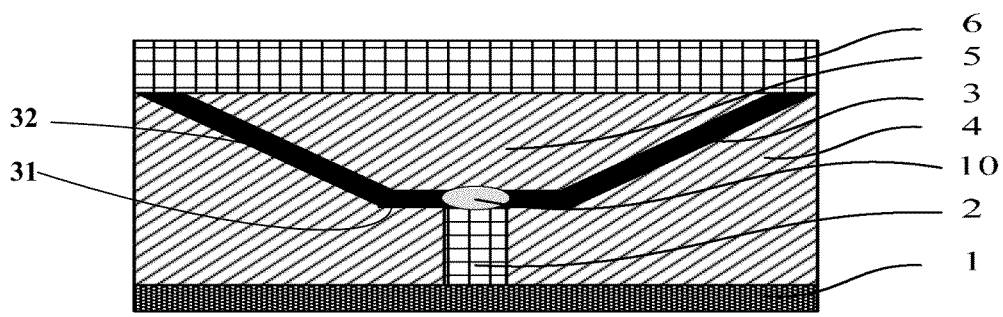

Step 4, referring to FIG. 34 to FIG. 36, as shown in FIG. 34, the phase-change material layer 3 is deposited by adopting PVD, ALD or CVD, to form a hollow inverted conical frustum formed by connecting the side wall layer 32 and the round bottom layer 31 and having an opening at an upper part; then the second medium layer 5 used for internally filling the hollow inverted conical frustum is deposited by adopting low-temperature ALD or low-temperature CVD; as shown in FIG. 35, polishing is performed to remove redundant second medium and phase-change material except the hole 8 in the cylindrical structure and on the first medium layer 4, until the remaining second medium and phase-change material is even with the first medium layer; as shown in FIG. 36, then the upper electrode 6 is prepared by adopting PVD, ALD or CVD. FIG. 36 schematically shows a phase-change region 10 of the phase-change storage unit in this embodiment.

Specifically, in-situ warming is performed when the phase-change material layer is deposited, so that the phase-change material layer is crystallized during preparation, so as to avoid that the volume shrinkage during transformation from an amorphous state to a crystalline state is left to the device; the temperature of the in-situ warming ranges from 200 to 400° C., so as to avoid that the phase-change material layer generates element segregation or volatilization. Warming may also not be performed when the phase-change material layer is deposited, while warming is performed on the phase-change material layer when the second medium layer is deposited, so that the phase-change material layer is crystallized, the temperature of the warming ranges from 200 to 400° C., so as to avoid that the phase-change material layer generates element segregation or volatilization. The diameter of the round bottom layer 31 ranges from 5 to 30 nm, and the thickness thereof ranges from 1 to 10 nm. The thickness of the side wall layer ranges from 2 to 15 nm. The cylindrical lower electrode 2 and the upper electrode 6 may be made of TiN, W, Al, Ti, Cu, graphite or other conductive materials, and the height of the cylindrical lower electrode 2 is smaller than or equal to 500 nm. The first medium layer 4 and the second medium layer 5 may be made of Sift, $Si_3N_4$ or other insulating materials. In this embodiment, the cylindrical lower electrode 2 is preferably made of TiN or W, and the upper electrode 6 is preferably made of TiN.

In the phase-change storage unit prepared in this implementation, the diameter of the cylindrical lower electrode ranges from 2 to 5 nm, the diameter of the round bottom layer of the phase-change material layer is greater than the diameter of the cylindrical lower electrode, and the side wall layer and the round bottom layer of the phase-change material layer are not vertical to each other, to form a phase-change storage unit with a side wall in a slant structure of a small electrode.

To sum up, in the phase-change storage unit for replacing DRAM and FLASH and the manufacturing method thereof of the present invention, the phase-change material is prepared into a thin film, in which a medium is filled, the thickness of the thin film is very small (the thickness of the round bottom layer ranges from 1 to 10 nm, and the thickness of the side wall layer ranges from 2 to 15 nm), the thickness of the phase-change thin-film is limited as much as possible by adopting a medium material, and the phase-change thin-film whose one-dimensional size may continue to be shrunk is constructed in the device while the three-dimensional size of the device is shrunk at an equal ratio, so that the performance of the device is improved. Therefore, the present invention effectively overcomes various disadvantages in the prior art and has a high industrial use value.

The aforementioned embodiments only exemplarily illustrate the principle and the efficacy of the present invention instead of being used for limiting the present invention. Any person skilled in the art may modify or change the aforementioned embodiments without violating the spirit and the scope of the present invention. Therefore, all equivalent modifications or changes completed by persons having common sense in the technical field without departing from the spirit and the technical idea disclosed in the present invention should still be covered by claims of the present invention.

What is claimed is:

1. A method for manufacturing a phase-change storage unit, comprising the following steps:

a) providing a metal electrode layer, growing a first medium layer on the metal electrode layer, and preparing a cylindrical hole on the first medium layer, to form the first medium layer with the cylindrical hole, wherein a depth of the cylindrical hole is equal to a thickness of the first medium layer;

b) depositing a lower electrode metal material on the first medium layer with the cylindrical hole, and performing polishing to remove the lower electrode metal material except the cylindrical hole, wherein the remaining lower electrode metal material is even with the first medium layer;

c) performing etching-back on a structure after the polishing in the step 2), to form a hole in a cylindrical structure or inverted conical frustum structure, wherein the remaining lower electrode metal material forms a cylindrical lower electrode; and d) depositing a phase-change material layer, to form a hollow cylinder or hollow inverted conical frustum formed by connecting a side wall layer and a round bottom layer and having an opening at an upper part; then depositing a second medium layer used for internally filling the hollow cylinder or hollow inverted conical frustum; and then performing polishing to remove redundant second medium and phase-change material except the hole in the cylindrical structure or inverted conical frustum structure until the remaining second medium and phase-change material is even with the first medium layer, and then preparing an upper electrode.

2. The method for manufacturing a phase-change storage unit as in claim 1, wherein in-situ warming is performed when the phase-change material layer is deposited in the step 4); temperature of the in-situ warming ranges from 200 to 400° C.

3. The method for manufacturing a phase-change storage unit as in claim 1, wherein warming is performed when the second medium layer is deposited in the step 4); temperature of the warming ranges from 200 to 400° C.

4. The method for manufacturing a phase-change storage unit as in claim 1, wherein a thickness of the round bottom layer ranges from 1 to 10 nm, and a thickness of the side wall layer ranges from 2 to 15 nm.

5. The method for manufacturing a phase-change storage unit as in claim 1, wherein a diameter of the round bottom layer is equal to or greater than a diameter of the cylindrical lower electrode.

6. The method for manufacturing a phase-change storage unit as in claim 5, wherein a thickness of the round bottom layer ranges from 1 to 10 nm, and a thickness of the side wall layer ranges from 2 to 15 nm.

* * * * *